United States Patent [19]
Aleksoff et al.

[11] Patent Number: 5,208,685
[45] Date of Patent: May 4, 1993

[54] COMPACT OPTICAL PROCESSOR

[75] Inventors: Carl C. Aleksoff; Nikola S. Subotic, both of Ann Arbor, Mich.

[73] Assignee: Environmental Research Institute of Michigan, Ann Arbor, Mich.

[21] Appl. No.: 820,498

[22] Filed: Jan. 14, 1992

[51] Int. Cl.$^5$ .................................................. G02B 5/32
[52] U.S. Cl. .................................. 359/19; 250/208.1; 385/129; 364/822
[58] Field of Search ................ 359/15, 19; 250/201.9, 250/208.1; 385/89, 93, 129, 130; 364/712, 713, 725, 726, 822, 825, 827

[56] References Cited

U.S. PATENT DOCUMENTS

| | | | |
|---|---|---|---|
| 4,270,047 | 5/1981 | Mochizuki et al. | 250/208.1 |
| 4,551,629 | 11/1985 | Carson et al. | 250/208.1 |
| 4,737,621 | 4/1988 | Gonsiorowski et al. | 250/201.9 |
| 4,919,536 | 4/1990 | Komine | 356/337 |
| 5,144,636 | 9/1992 | Yoshida et al. | 385/130 |

OTHER PUBLICATIONS

"10th International Computing Conference", Optical-Hybrid Backprojection Processes, pp. 89–95.
"Design of High-Numerical-Aperture Holographic Gratings for Integrated Optics Readout Heads", *Holographic Optics: Design and Application*, pp. 188–193.
"Real-Time Programmable Acoustooptic Synthetic Aperture Radar Processor", *Applied Optics*, pp. 1786–1796.
"Comparison of Hybrid-Optical and Digital Computers for Real-Time 2-D Fourier Transform Based Operations", *Real-Time Signal Processing for Industrial Applications*, Jun. 1988.
"Compact Real-Time Interferometric Fourier Transform Processors", *Optical Information-Processing and Systems Architecture II*, Dec. 1990.

*Primary Examiner*—Bruce Y. Arnold
*Assistant Examiner*—J. P. Ryan
*Attorney, Agent, or Firm*—Krass & Young

[57] ABSTRACT

This invention is a compact optical processor including a coherent light source, plural optical elements that together form a Fourier transform interferometer, and a two dimensional detector array. The light source generates a two dimensional input optical wavefront intensity modulated according to the input signal. The optical elements are formed as slab-like members with parallel input and output surfaces. These optical elements are disposed abutting in tandem. The light detecting device includes a two dimensional array of photosensitive elements generating an image signal corresponding to the processed two dimensional optical wavefront. The plural optical elements preferably include at least one acousto-optical element forming a two dimensional scanner. The plural optical elements may further includes a holographic optical element to block light undiffracted by the scanning elements. The plurality of optical elements may include a modified Kösters interferometer with a beam splitter and two orthogonally disposed roof prisms. The optical processor may operate on plural input signals on separate wavelengths employing sets dichroic beam splitters to assemble and separate plural wavelengths from separate point sources.

23 Claims, 3 Drawing Sheets

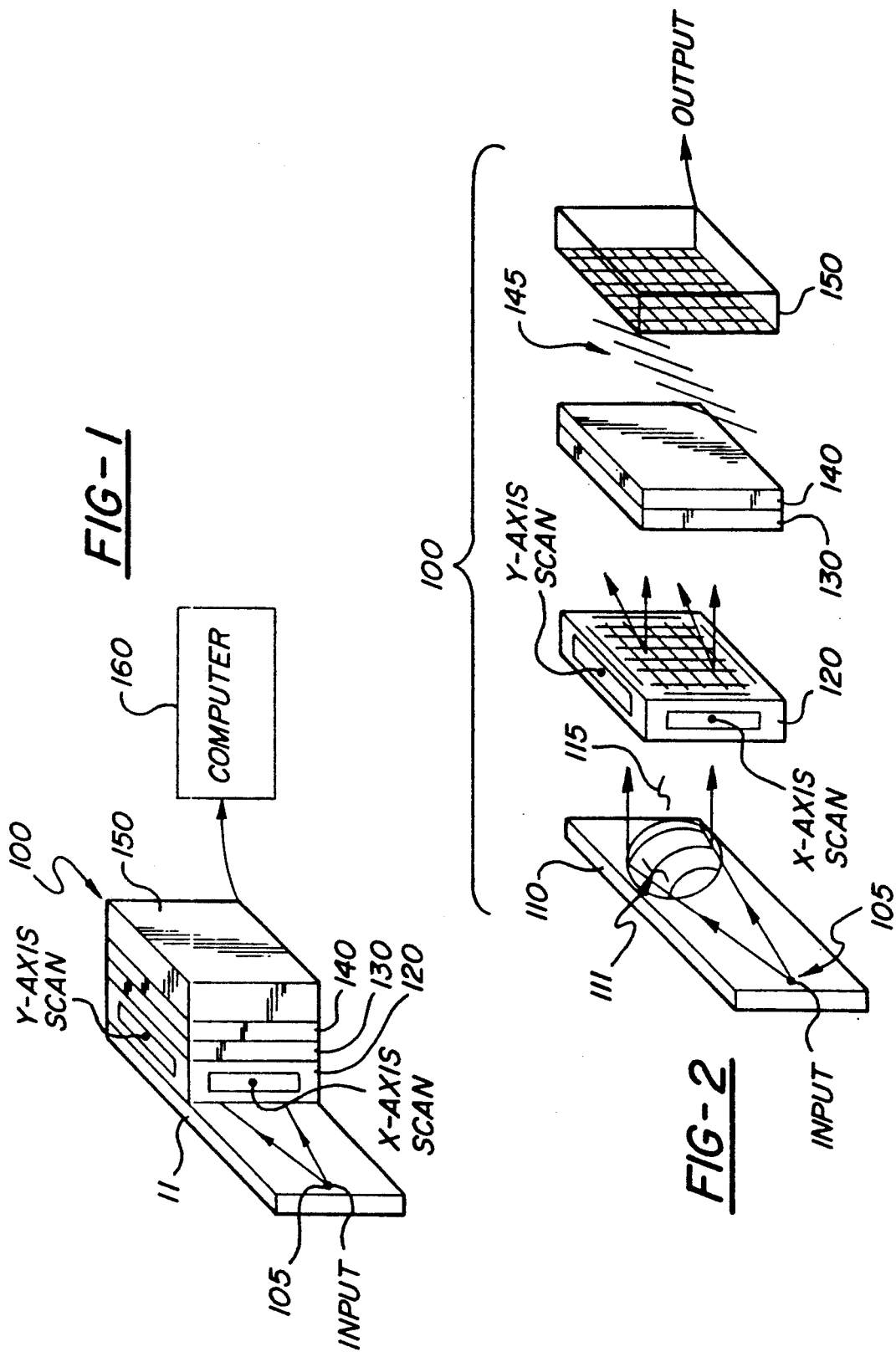

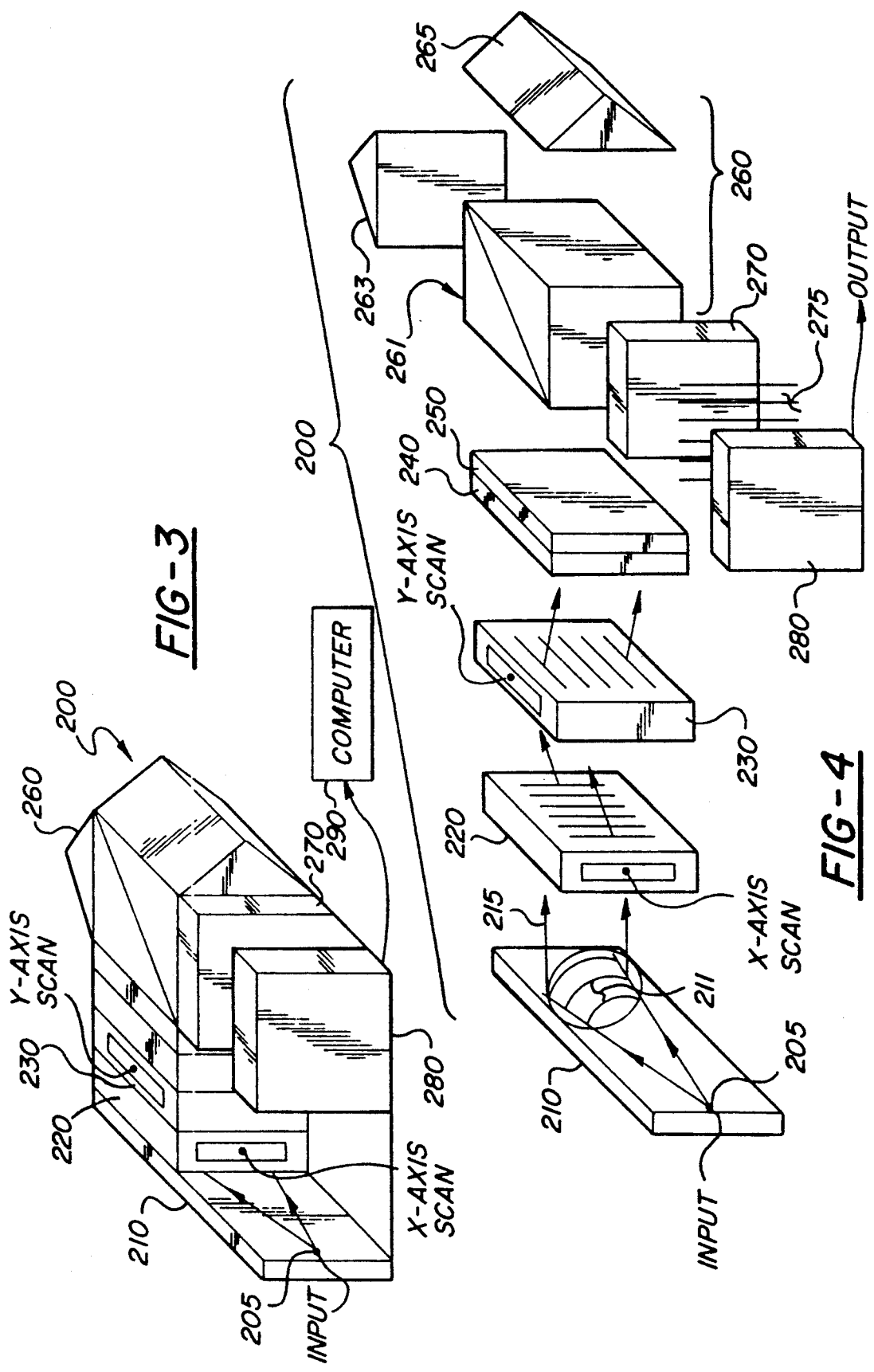

COMPACT OPTICAL PROCESSOR

TECHNICAL FIELD OF THE INVENTION

The field of the invention is that of optical processors and particularly interferometric optical processors used for Fourier transform processing.

BACKGROUND OF THE INVENTION

There are many data processing tasks that lend themselves to optical processing. Optical processing is advantageous because each point of a two dimensional wavefront traveling through an optical element is processed simultaneously. In addition there is virtually no interaction between the separate points of the two dimensional wavefront. In some applications this parallelism is very valuable.

One of the fields where optical data processing is advantageous is that of synthetic aperture radar. These systems are often placed aboard aircraft, spacecraft or other remote platforms. Therefore it would be advantageous to provide a real time optical processor in a lightweight, compact form that uses a minimum of electric power.

SUMMARY OF THE INVENTION

This invention is a real time, compact, light weight and power efficient optical processor. The compact optical processor includes: a light source; plural optical elements that together form a Cosine or Fourier transform interferometer; and a two dimensional detector array.

The light source generates a two dimensional input optical wavefront whose intensity is time modulated according to the input signal, such as from a synthetic aperture radar. This light source is preferably sufficiently coherent to form the required Fourier transform interference. A laser diode is suitable as the light source.

The optical elements are disposed in tandem with the processed light passing through numerous optical elements before detection. These optical elements may be formed as slab-like members. Each optical element receives a two dimensional optical wavefront and produces a processed two dimensional optical wavefront. The input of the first optical element receives the two dimensional input optical wavefront of the light generating device. In the case of generally slab-like optical elements the input and output surfaces are generally parallel with the input surface of one element receiving light by abutting the output surface of the previous optical element.

A light detecting device serves as the optical processor output. The light detecting device includes a two dimensional array of photosensitive elements receiving the processed two dimensional optical wavefront of the last optical element. Each photosensitive element generates an electrical signal corresponding to the intensity of received light. The light detecting device thereby generates an image signal corresponding to the processed two dimensional optical wavefront.

The light generating device preferably includes a slab waveguide. This slab waveguide occupies a plane parallel to the input surface of the first optical element. A point source of coherent light is located in an extension of the slab waveguide beyond the input surface of the first optical element with light. A holographic optical element transversely couples light from the point source into the input surface. The holographic optical element forms the two dimensional collimated input optical wavefront. The more common arrangement of a collimating lens may be used instead of this slab waveguide.

The plurality of optical elements includes some form of two dimensional scanner. This two dimensional scanner preferably includes one or more acousto-optic elements. In a first embodiment, a single acousto-optic element includes first and second orthogonally directed linear acoustic traveling waves that splits and scans the input two dimensional optical wavefront input in two dimensions by diffraction. The first and second linear acoustic traveling waves are preferably perpendicular. Separate electrical inputs specify the first and second linear acoustic traveling waves. In a second embodiment, two acousto-optic elements provide orthogonal scanning by separate sets of linear acoustic traveling waves.

The plurality of optical elements may further include a filter to block light undiffracted by the scanning elements as well as higher order diffracted light. This is preferably a holographic optical element disposed following the acousto-optic element or elements. This holographic optical elements blocks the undiffracted light and the higher order diffracted light by embedded interference fringes using Bragg diffraction. This structure forms a pass band of a limited range of incident propagation vectors, discriminating between the first order diffracted and undiffracted light or higher order diffracted light. This holographic optical element may also act as a spatial modulator for correcting the wavefront incident at the detector array.

The interferometer illustrated in FIGS. 1 and 2 does not provide fixed interference fringes. The interference fringes move because the two first order diffracted wavefronts from acousto-optic device 120 are frequency shifted by the different acoustic frequencies. The preferable technique imparts additional intensity modulation on the input light at the same frequency as the frequency difference of the wavefronts produced by acousto-optic device 120. This additional modulation is accomplished by mixing the input signal with the difference frequency drive signal for acousto-optic device 120 in the manner taught in U.S. Pat. Nos. 4,847,796 and 5,040,135.

The plurality of optical elements may include a modified Kösters interferometer. The modified Kösters interferometer includes a cubic beam splitter that splits the output wavefront from the prior optical element into two beams. Each beam enters a roof top reflector abutting a face of the cubic beam splitter. The roof top reflectors reflect the two dimensional optical wavefront reversing the field of the two dimensional optical wavefront along a first axis and reproducing the field along a perpendicular axis. These roof top reflectors can be embodied by orthogonally disposed roof prisms or orthogonally disposed flat mirrors. The cubic beam splitter reassembles the reflected beams. The resulting interference between these two wavefronts produces a sinusoidal fringe pattern whose frequency and direction is controlled by the input light direction. This input light direction is in turn controlled by the acousto-optic scanners. A lens images the roof top position of the two reassembled beams and hence the fringe pattern to the light detecting device. The time integration of the light intensity detected by the light detecting device produces the final desired Fourier transform.

The optical processor may operate on plural input signals on separate wavelengths. A first set of dichroic beam splitters disposed in tandem forms a two dimensional input optical wavefront at plural wavelengths from plural point sources. This light is supplied to the input surface of the first optical element. The plural optical elements then process the input light on the plural wavelengths. The wavelengths do not interact, thus assuring parallel processing of plural input signals. A similar set of dichroic beam splitters disposed tandem receives the processed wavefronts on the plural wavelengths. Each of these dichroic beam splitters separates out one of the wavelengths. The separated wavelengths are detected by corresponding two dimensional arrays of photosensitive elements. The processed wavefronts may also be separated by diffraction gratings of a Bragg effect optical element.

BRIEF DESCRIPTION OF THE DRAWINGS

These and other objects and aspects of the present invention will become clear from the following description of the invention, in which:

FIG. 1 illustrates a compact optical processor according to one embodiment of this invention;

FIG. 2 illustrates an exploded view of the optical parts of the compact optical processor of FIG. 1;

FIG. 3 illustrates a compact optical processor according to a second embodiment of this invention;

FIG. 4 illustrates an exploded view of the optical parts of the compact optical processor of FIG. 3.

DETAILED DESCRIPTION OF THE PREFERRED EMBODIMENTS

Figure 5:
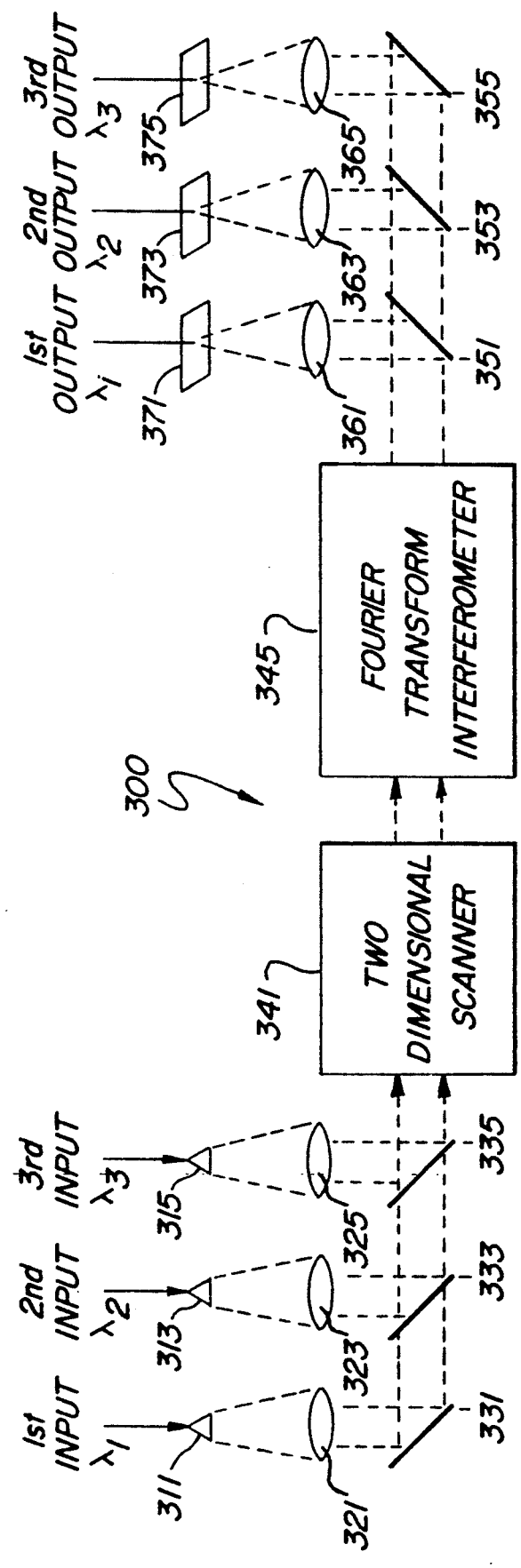
FIG. 5 illustrates the optical parts of a third embodiment of this invention processing multiple signals.

This invention is an optical processor that can be constructed in a compact package. Packing without intermediate lenses permits this compactness. Compact optical processors of this invention are suitable for computations for synthetic aperture radar.

Synthetic aperture radar processing generates two dimensional image data in range and cross-range representing the reflectivity and scattering properties of a target scene. The far field nature of the geometry between the synthetic aperture radar and the target insures the data collected by the synthetic aperture radar is a complex-valued spatial spectrum of the scene reflectivity. Prior to processing, the data is corrected to a single scene point. This may be done using a "spotlight" format in which the radar transmitting and receiving antenna beams are steered to track a single point location. Alternatively, the radar received signal may be mathematically corrected. Equation (1) indicates the formation of a scene from a frame of synthetic aperture data corrected to a single point:

$$w(\bar{r}) = \int W(\bar{f}) e^{j2\pi \bar{r} \cdot \bar{f}} d\bar{f} \quad (1)$$

where: $\bar{f} = (\hat{R}_1 + \hat{R}_2)v/c$ is the spatial spectrum position vector; v is the instantaneous transmitter radar temporal frequency assuming a frequency chirp/dechirp radar: $w(\bar{r})$ is the image of the scene reflectivity; $W(\bar{f})$ is the spatial spectrum data received by the synthetic aperture radar; $R_1 = R_1 \hat{R}_1$ in the vector position of the synthetic aperture radar transmitter to the coordinate origin fixed at the target; and $R_2 = R_2 \hat{R}_2$ in the vector position of the synthetic aperture radar receiver to the coordinate origin fixed at the target.

The collected data in spatial spectrum space is known as the phase history. The image of the scene is formed from the phase history in effect by computing the two dimensional Fourier transform as noted in equation (1). As a result of the relative motion between the synthetic aperture radar and the scene history corrected to a single point, the phase history is generally located in spatial spectrum space along polar lines. This format of the phase history data introduces a problem with digital processing. The fast Fourier transform algorithm, which is efficiently executed in digital processors, requires rectangularly formatted data. Prior art digital processors have interpolated the phase history data into rectangular coordinates before computing the Fourier transform. In many instances this interpolation requires more computation that the Fourier transform. In this environment optical processing can be very valuable since it in effect produces the interpolation automatically without additional computation.

The nature of the data acquisition in synthetic aperture radar makes serial processing convenient. Synthetic aperture radar data is acquired serially as echo returns are received. Computation of the Fourier transform may be partitioned because of the linearity of Fourier transforms. Thus the input data $W(\bar{f})$ may be divided into N non-overlapping partitions $W_n(\bar{f})$ where:

$$W(\bar{f}) = \sum_{n=1}^{N} W_n(\bar{f}) \quad (2)$$

The apparatus computes the Fourier transform of a partition of the input data as follows:

$$w_n(\bar{r}) = \int W_n(\bar{f}) e^{j2\pi \bar{r} \cdot \bar{f}} d\bar{f} \quad (3)$$

The Fourier transform of the entire input data is formed by summing the partial Fourier transforms of the partitioned data as follows:

$$w(\bar{r}) = \sum_{n=1}^{N} w_n(\bar{r}) \quad (4)$$

In the compact optical processor of this invention the partitioning of the input data noted in equation (2) is a natural consequence of the synthetic aperture radar process. The compact optical processor serially forms the Fourier transforms of equation (3) optically as the phase history data is received. Lastly, the summation of equation (4) is formed in part optically by integration at the detector and in part electronically following detection of the light used in the optical processor.

The compact optical processor of this invention will be described in conjunction with three embodiments. FIGS. 1 and 2 illustrate a near-in-line embodiment of this invention. FIGS. 3 and 4 illustrate a modified Köster's Interferometer embodiment. FIG. 5 illustrates the optical parts of a system usable with either of the above embodiments that permits simultaneous operation on plural wavelengths.

FIG. 1 illustrates a near-in-line embodiment of compact optical processor 100. FIG. 2 illustrates the optical parts of the compact optical processor 100 of FIG. 1 in exploded form for better understanding of their assembly. The optical elements of compact optical processor 100 are generally formed as slabs. Each optical element has an input surface for receiving a two dimensional optical wavefront and an output surface that produces another two dimensional optical wavefront processed by that element. These input and output surfaces are generally parallel. Compact optical processor 100 is coupled to computer 160 that forms the desired image.

The light source for compact optical processor 100 is laser diode 105. Laser diode 105 is intensity modulated by the input signal to be transformed. The synthetic aperture radar data may be negative. A bias is added to the input signal in order to preserve a non-negative input to laser diode 105. Coherent light from laser diode 105 propagates down a slab waveguide 110 dispersing because of the source aperture. Extended holographic coupler 111 forms plane wavefront 115 and transversely couples this light into the input surface of the first optical element. The input signal to compact optical processor 100 provides intensity modulation to laser diode 105. Laser diode 105 serves as the source of coherent light needed by the optical processor. Another light source of sufficient coherence may be used instead of a laser diode.

The interference of two diffracted orders of the input plane wavefront 115 produces the optic output from optical processor 100. The diffractions are formed in acousto-optic device 120. Acousto-optic device 120 produces two orthogonally propagating acoustic waves within the same substrate. A first transducer receives a X-axis scan signal and produces horizontally propagating waves. A second transducer produces vertically propagating waves form a Y-axis signal. Each set of waves produces a regular change in the effective index of refraction of acousto-optic device 120. These regular changes in the effective index of refraction act as a diffraction grating at the wavelength of the input illumination. At any instant the input plane wavefront is diffracted off the central axis into two wavefronts by the pattern of effective index of refraction. Because both the X-axis and the Y-axis acoustic waves are driven by variable frequency signals, the acousto-optic device 120 scans the orthogonally diffracted plane wavefront to produce a variable fringe pattern at the detector 150.

Holographic optical element 130 serves to filter out the unwanted, undiffracted wavefront and higher order diffracted wavefronts from acousto-optic device 120. Holographic optical element 130 employs Bragg diffraction to discriminate between the incident propagation vectors of the light. Holographic optical element 130 preferably passes light within a desired spatial pass band of the direction of the propagation vector. Light with other propagation vectors, such as light undiffracted in acousto-optic device and light of higher diffracted orders, is blocked. Mask 140 blocks light outside a predetermined area. Holographic optical element 130 may also serve as a modulation grating if the linear spatial carrier is desired at the output, such as when the interference has too high a spatial frequency for the detector. Wavefront 145 shows the resultant interference fringes formed by the interference between the two desired diffracted wavefronts. The interference fringes are made stationary by modulating the light source at the same frequency as the sum or difference frequency of the two interfering wavefronts.

The first diffracted order from each of the two sets of propagating acoustic waves in acousto-optic device 120 interfere at detector 150. This forms a cosine transform of the input plane wavefront 115 at detector 150. Detector 150 is preferably an array of some type of energy accumulating photosensitive cells, such as a charge coupled device. The output of detector 150 is periodically digitized and stored in computer 160. Computer 160 then forms in part the final summation noted in equation (4). Detector 150 is preferably read out before saturating the dynamic range of its individual photosensitive cells permitting linear summation in computer 160.

A part of the final summation process in computer 160 involves elimination of the output bias. The bias formed by the incoherent addition of partitioned data as indicated by equation (4) would saturate the photosensitive elements of detector 150 due to its limited dynamic range unless periodically read and cleared. Bias subtraction may take place as a straight forward subtraction of the detected signals if the bias is known or can be measured. Alternatively, an alternating technique may be used. Alternate partitions $W_n(\bar{f})$ are subtracted from the input bias rather than being added to the input bias. Likewise, alternate reads of detector 150 are subtracted rather than being added to the computer memory. This results in cancellation of the input bias and unknown fixed noise signals in each pair of summed partitions $w_n(\bar{r})$.

FIG. 3 illustrates a modified Köster's interferometer embodiment of compact optical processor 200. FIG. 4 illustrates the optical parts of the compact optical processor 200 of FIG. 3 in exploded form for better understanding of their assembly. The optical elements of compact optical processor 200 are generally similar to those previously describe in conjunction with FIGS. 1 and 2.

Optical processor 200 employs a slab waveguide 210 similar to slab waveguide 110. The output intensity of laser diode 205 is modulated according to the input signal. The light from laser diode 205 disperses because of the source aperture and is formed into a plane wavefront 215 by extended holographic coupler 211.

Optical processor 200 employs two separate acousto-optic devices 220 and 230 to scan the incoming wavefront. Acousto-optic device 220 receives the X-axis scan signal and produces horizontally propagating waves. Acousto-optic device 230 produces vertically propagating waves from a Y-axis signal. Separate acousto-optic devices for the two scanning directions are easier to construct than the single acousto-optic scanning device 120. Optical processor 200 forms the interference in a different manner, as described below. Holographic optical element 240 serves to filter out the unwanted, undiffracted wavefront and the higher order diffracted wavefronts from the two acousto-optic devices 220 and 230. Mask 250 blocks all light outside a predetermined area.

The required interference is formed in modified Köster's interferometer 260. Modified Köster's interferometer 260 includes beam splitter 261, which splits the received optical wavefront into two beams. The first of these beams is reflected to roof prism 263. The second beam is transmitted to roof prism 265. These roof prisms 263 and 265 perform coordinate transformation on the received light. Each roof prism transforms the light in one coordinate and leaves the other coordinate unaffected. A characteristic of these roof prisms is that the reflected light reproduces the component of the propagation vector perpendicular to the axis of the roof and doubles the component of the propagation vector parallel to the axis of the roof. The two roof prisms are disposed perpendicularly. FIGS. 3 and 4 illustrate that roof prism 263 has a vertical axis and roof prism 265 has a horizontal axis.

The reflected light from the two roof prisms 263 and 265 are reassembled by beam splitter 261. This reassembled pair of beams is imaged at the roof top position by lens 270 onto detector 280. The interference between the two reassembled beams is formed at detector 280. Detector 280 is constructed in the manner of detector 150. Computer 290 operates in the same fashion as computer 160.

FIG. 5 illustrates an embodiment of this invention that provides simultaneous optical processing on plural wavelengths. Respective first, second and third inputs are supplied to laser diodes 311, 313 and 315. Laser diodes 311, 313 and 315 operate on the differing respective wavelengths $\lambda_1$, $\lambda_2$, and $\lambda_3$. Light from the laser diodes are collimated in respective lenses 321, 323 and 325. Those skilled in the art would realize other types of collimating optics such as reflectors or holographic optical elements could be used instead of lenses and beam splitters. A set of dichroic beam splitters 331, 333 and 335 assemble an optical wavefront on the plural wavelengths. Dichroic beam splitter 331 reflects light on wavelength $\lambda_1$ to the input of two dimensional scanner 341. Dichroic beam splitter 333 reflects light on wavelength $\lambda_2$ to the input of two dimensional scanner 341 while transmitting light on wavelength $\lambda_1$ unaffected. Lastly, dichroic beam splitter 335 reflects light on wavelength $\lambda_3$ to the input of two dimensional scanner 341 while transmitting light on wavelengths $\lambda_1$ and $\lambda_2$ unaffected.

Two dimensional scanner 341 and Fourier transform interferometer 345 optically process the plural optical wavefronts on differing wavelengths. Two dimensional scanner 341 scans the plural optical wavefronts in two dimensions. Two dimensional scanner 341 may be embodied in a single acousto-optic device such as acousto-optic device 120 illustrated in FIGS. 1 and 2, or in a pair of orthogonally scanning acousto-optic devices such as acousto-optic devices 220 and 239 illustrated in FIGS. 3 and 4. Fourier transform interferometer 345 forms the Fourier transform of the input plural optical wavefronts. Fourier transform interferometer 345 forms the solution to equation (3) for partitions of the input data as received. Fourier transform interferometer 345 could be embodied in the interferometer as illustrated in FIGS. 1 and 2 or in the modified Köster's interferometer as illustrated in FIGS. 3 and 4.

The processed optical wavefronts are separated by wavelength after processing. Dichroic beam splitter 351 reflects light of the wavelength $\lambda_1$ to focussing lens 361 while transmitting light of other wavelengths unaffected. Lens 361 focuses the light of wavelength $\lambda_1$ onto a first detector array 371. First detector array 371 forms a first output signal. This first output signal corresponds to the first input signal as processed by optical processor 300. Dichroic beam splitter 353 reflects light of the wavelength $\lambda_2$ to focussing lens 363, which focuses this light onto second detector array 373. Second detector array 373 forms a second output signal corresponding to the second input signal. Lastly, dichroic beam splitter 355 reflects light of wavelength $\lambda_3$ to focussing lens 365 that focusses this light onto third detector array 377. Third detector array 375 forms a third output signal corresponding to the third input signal. Those skilled in the art would realize that other types of imaging systems, such as reflectors or holographic optical elements, could be substituted for focussing lenses 361, 363 and 365 and beam splitters 351, 353 and 355.

Optical processor 300 provides independent processing of three signals. This independent processing is feasible because the photons on the three differing wavelengths do not interact in two dimensional scanner 341 nor in the Fourier transform interferometer 345. The dichroic beam splitters permit assembly of a multiple wavelength input and separation of the processed outputs. One skilled in the art would also realize that chromatic diffraction gratings could be used to assemble separate the wavefronts of the plural wavelengths. Optical processor 300 could process additional wavelengths with the inclusion of a laser diode, an input dichroic beam splitter, an output dichroic beam splitter and a detector array for each additional wavelength. Optical processor 300 could serve as processor for multiple synthetic aperture radars located on the same platform, could process in parallel different portions of the same input signal, or could process in parallel different polarization channels of a single polarimetric synthetic aperture radar.

We claim:

1. An optical processor comprising:
   a light generating device for generating a plurality of two dimensional input optical wavefronts at predetermined differing wavelengths, each two dimensional input optical wavefront having an intensity modulated according to a corresponding input signal;
   a plurality of optical elements, each optical element receiving a plurality of two dimensional optical wavelengths at said predetermined wavelengths of said light generating device and outputting a plurality of processed two dimensional optical wavefronts, said plurality of optical elements disposed in tandem with a first said optical element receiving said plurality of two dimensional input optical wavefronts at said predetermined wavelengths of said light generating device and each later optical element receiving said processed two dimensional optical wavefronts output by the prior optical element; and
   a light detecting device for receiving said plurality of processed two dimensional optical wavefronts of said last optical element and having a plurality of two dimensional arrays of photosensitive elements, each two dimensional array of photosensitive elements receiving light of a corresponding wavelength, each photosensitive element of each two dimensional array generating an electrical signal corresponding to the intensity of received light thereby generating a plurality of image signals corresponding to said plurality of processed two dimensional optical wavefronts of said last optical element.

2. The optical processor claimed in claim 1, wherein:
   at least some of said optical elements consist of generally slab-like members, each having an input surface for receiving said two dimensional optical wavefront and an output surface for outputting said processed two dimensional optical wavefront, said input surface of al least one of said slab-like members abutting said output surface of a prior slab-like member.

3. The optical processor claimed in claim 1, wherein: said light generating device includes a point source of coherent light having an intensity modulated corresponding to the input signal, and an optical collimating element disposed relative to said point source of coherent light for formation of a collimated beam of light.

4. The optical processor claimed in claim 3, wherein: said light generating device wherein said optical collimating element consists of a slab waveguide including a transverse surface receiving light from said point source of coherent light, and a holographic optical element disposed opposite said first optical element for transversely coupling light from said point source of coherent light into said first optical element thereby forming said two dimensional input optical wavefront.

5. The optical processor claimed in claim 3, wherein: said light generating device wherein said point source of coherent light consists of a laser diode.

6. The optical processor claimed in claim 1, wherein: said plurality of optical elements includes an acousto-optic element having a first linear acoustic traveling wave and a second linear acoustic traveling wave perpendicular to said first linear acoustic traveling wave, whereby the input two dimensional optical wavefront input at said input surface is diffracted by said first and second linear acoustic traveling waves providing two orthogonally scanned two dimensional optical wavefronts.

7. The optical processor claimed in claim 6, wherein: said acousto-optic element includes a first electrical input for specifying said first linear acoustic traveling wave and a second electrical input for specifying said second linear acoustic traveling wave.

8. The optical processor claimed in claim 7, wherein: said light generating device being further intensity modulated according to the signals supplied to said first and second electrical inputs of said acousto-optic element.

9. The optical processor claimed in claim 6, wherein: said plurality of optical elements further includes a holographic optical element disposed following said acousto-optic element adapted to block light other than light diffracted to the first order by said first and second linear acoustic traveling waves of said acousto-optic element.

10. The optical processor claimed in claim 9, wherein: said holographic optical element includes embedded interference fringes adapted to use Bragg diffraction forming a pass band of a limited range of incident propagation vectors.

11. The optical processor claimed in claim 6, wherein: said plurality of optical elements further includes a holographic optical element disposed following said acousto-optic element including embedded interference fringes adapted to act as a modulation grating.

12. The optical processor claimed in claim 1, wherein: said plurality of optical elements includes a first acousto-optic element having a first linear acoustic traveling wave, said first linear acoustic traveling waves diffracting the input two dimensional optical wavefront input at said input surface providing a one dimensional scanning propagation vector to the input two dimensional optical wavefront, a second acousto-optic element having a second linear acoustic traveling wave perpendicular to said first linear acoustic traveling wave of said first acousto-optic element, said second linear acoustic traveling waves diffracting the input two dimensional optical wavefront input at said input surface providing a one dimensional scanning propagation vector to the input two dimensional optical wavefront perpendicular to said one dimensional scanning propagation vector of said first linear acoustic traveling waves.

13. The optical processor claimed in claim 12, wherein:

said plurality of optical elements wherein said first acousto-optic element includes a first electrical input for specifying said first linear acoustic traveling wave, and said second acousto-optic element includes a second electrical input for specifying said second linear acoustic traveling wave.

14. The optical processor claimed in claim 12, wherein:

said plurality of optical elements further includes a holographic optical element disposed following said first and second acousto-optic elements adapted to block light other than light diffracted to the first order by said first linear acoustic traveling waves of said first acousto-optic element and said second linear acoustic traveling waves of said second acousto-optic element.

15. The optical processor claimed in claim 14, wherein:

said holographic optical element includes embedded interference fringes adapted to use Bragg diffraction forming a pass band of a limited range of incident propagation vectors.

16. The optical processor claimed in claim 12, wherein:

said plurality of optical elements further includes a Fourier transforming interferometer including a cubic beam splitter having a first face forming said input surface, said cubic beam splitter splitting said input two dimensional wavefront into a first beam propagating to a second face opposite said first face and a second beam propagating to a third face perpendicular to said first face, a first reflecting device abutting said second face of said cubic beam splitter for reflecting the two dimensional optical wavefront in a manner reversing the field of the two dimensional optical wavefront along a first axis and reproducing the field of the two dimensional optical wavefront along a second axis perpendicular to said first axis, a second reflecting device abutting said third face of said cubic beam splitter for reflecting the two dimensional optical wavefront in a manner reversing the field of the two dimensional optical wavefront along said second axis and reproducing the field of the two dimensional optical wavefront along said first axis, and a lens disposed parallel to a fourth face of said cubic beam splitter, said fourth face being opposite said third face, for imaging the two dimensional optical wavefront from said first and second reflecting devices to an image plane; and said input surface of said light detecting device coincides with said image plane of said lens.

17. The optical processor claimed in claim 16, wherein:
said Fourier transforming interferometer wherein
said first reflecting device consists of a first roof prism having a base face abutting said second face of said cubic beam splitter and a pair of oblique reflecting faces joining at a first roof top edge perpendicular to said first axis, and
said second reflecting device consists of a second roof prism having a base face abutting said third face of said cubic beam splitter and a pair of oblique reflecting faces joining at a second roof top edge perpendicular to said second axis.

18. The optical processor claimed in claim 1, wherein:
said photosensitive elements of said light detecting device accumulate light energy and are periodically read out as frames and cleared;
said optical processor further comprising a computer coupled to receive the output of said light detecting device operative to form an electrical summation of a plurality of frames of said light detecting device.

19. The optical processor claimed in claim 18, wherein:
said modulation of the intensity of said light generating device includes a input bias added to said input signal to preserve a non-negative intensity of said light generating device; and
said computer is further operative to form said electrical summation of a plurality of frames of said light detecting device in a manner to remove bias formed by the incoherent accumulation of light energy by said light detecting device.

20. The optical processor claimed in claim 19, wherein:
said modulation of the intensity of said light generating device alternately adds said input signal to said input bias and subtracts said input signal from said input bias; and
said computer is further operative to form said electrical summation of a plurality of frames of said light detecting device by subtracting alternate frames.

21. The optical processor claimed in claim 1, wherein:
said light generating device includes
a plurality of point sources of coherent light equal in number to the number of said plurality of predetermined differing wavelengths, each point source generating light at a unique one of said predetermined differing wavelengths and having an intensity modulated according to a corresponding input signal,
a plurality of collimating optical elements equal in number to the number of said plurality of predetermined differing wavelengths, each collimating optical element formed a collimated beam of light from a corresponding one of said point sources of coherent light, and
a plurality of first dichroic beam splitters equal in number to the number of said plurality of predetermined differing wavelength disposed in tandem, each first dichroic beam splitter disposed for reflecting a corresponding one of said collimated beams of light into said first optical element thereby forming said two dimensional input optical wavefront at said predetermined differing wavelengths.

22. The optical processor claimed in claim 21, wherein:
said light generating device wherein
each of said point sources of coherent light consists of a laser diode.

23. The optical processor claimed in claim 1, wherein:
said light detecting device includes
a plurality of second dichroic beam splitters equal in number to the number of said plurality of predetermined differing wavelength disposed in tandem, each second dichroic beam splitter disposed for receiving said plurality of processed two dimensional optical wavefronts of said last optical element and reflecting light from a corresponding one of said plurality of predetermined differing wavelengths to a corresponding one of said plurality of two dimensional arrays of photosensitive elements.

* * * * *